(12) United States Patent
Podaima et al.

(10) Patent No.: US 6,392,910 B1
(45) Date of Patent: May 21, 2002

(54) PRIORITY ENCODER WITH MULTIPLE MATCH FUNCTION FOR CONTENT ADDRESSABLE MEMORIES AND METHODS FOR IMPLEMENTING THE SAME

(75) Inventors: Jason Edward Podaima, Kanata; Kenneth J. Schultz, Ontario, both of (CA)

(73) Assignee: SiberCore Technologies, Inc., Kanata (CA)

( * ) Notice: Subject to any disclaimer, the term of this patent is extended or adjusted under 35 U.S.C. 154(b) by 0 days.

(21) Appl. No.: 09/642,253

(22) Filed: Aug. 17, 2000

Related U.S. Application Data
(60) Provisional application No. 60/153,388, filed on Sep. 10, 1999.

(51) Int. Cl.[7] .............................................. G11C 15/00
(52) U.S. Cl. ...................... 365/49; 365/230.06; 395/485
(58) Field of Search ............................ 365/49, 230.06; 395/485

(56) References Cited

U.S. PATENT DOCUMENTS

| | | | |
|---|---|---|---|
| 4,532,606 A | 7/1985 | Phelps | 365/49 |
| 4,559,618 A | 12/1985 | Houseman et al. | 365/49 |
| 4,622,653 A | 11/1986 | McElroy | 365/49 |
| 4,646,271 A | 2/1987 | Uchiyama et al. | 365/49 |
| 4,670,858 A | 6/1987 | Almy | 365/49 |
| 4,723,224 A | 2/1988 | Van Hulett et al. | 365/49 |
| 4,758,982 A | 7/1988 | Price | 364/900 |
| 4,794,559 A | 12/1988 | Greenberger | 365/49 |
| 4,996,666 A | 2/1991 | Duluk, Jr. | 365/49 |
| 5,051,949 A | 9/1991 | Young | 365/49 |
| 5,319,590 A | 6/1994 | Montoye | 365/49 |
| 5,351,208 A | 9/1994 | Jiang | 365/49 |
| 5,467,319 A * | 11/1995 | Nusinov et al. | 365/231 |
| 5,555,397 A * | 9/1996 | Sasama et al. | 395/485 |
| 5,568,415 A | 10/1996 | McLellan et al. | 365/49 |
| 5,608,662 A | 3/1997 | Large et al. | 364/724.01 |
| 5,619,446 A * | 4/1997 | Yoneda et al. | 365/49 |
| 5,699,288 A | 12/1997 | Kim et al. | 365/49 |
| 5,784,709 A | 7/1998 | McLellan et al. | 711/207 |
| 5,828,593 A | 10/1998 | Schultz et al. | 365/49 |
| 5,859,791 A | 1/1999 | Schultz et al. | 365/49 |
| 6,230,236 B1 * | 5/2001 | Schultz et al. | 711/108 |

* cited by examiner

Primary Examiner—Vu A. Le
Assistant Examiner—Tuan T. Nguyen
(74) Attorney, Agent, or Firm—Martine & Penilla, LLP

(57) ABSTRACT

A priority resolver for use in a CAM circuit priority encoder is provided. The priority resolver includes one or more priority resolver sub-units. Each priority resolver sub-unit includes an local hit (pehit) generation circuitry. The local hit (pehit) generation circuitry is configured to generate pehit data. Also provided as part of a priority resolver sub-unit is a resolve processing circuit that is coupled to the local hit (pehit) generation circuitry. The resolve processing circuit is configured to receive the pehit data and an enable signal. Preferably, the resolve processing circuit includes input gating circuitry. An output differentiator and gating circuit is further provided as part of the priority resolver sub-unit and is configured to receive an output of the resolve processing circuit. In this embodiment, the priority resolver sub-unit is implemented in one or more stages of the priority resolver, and each stage is configured to include one or more priority resolver sub-units.

24 Claims, 12 Drawing Sheets

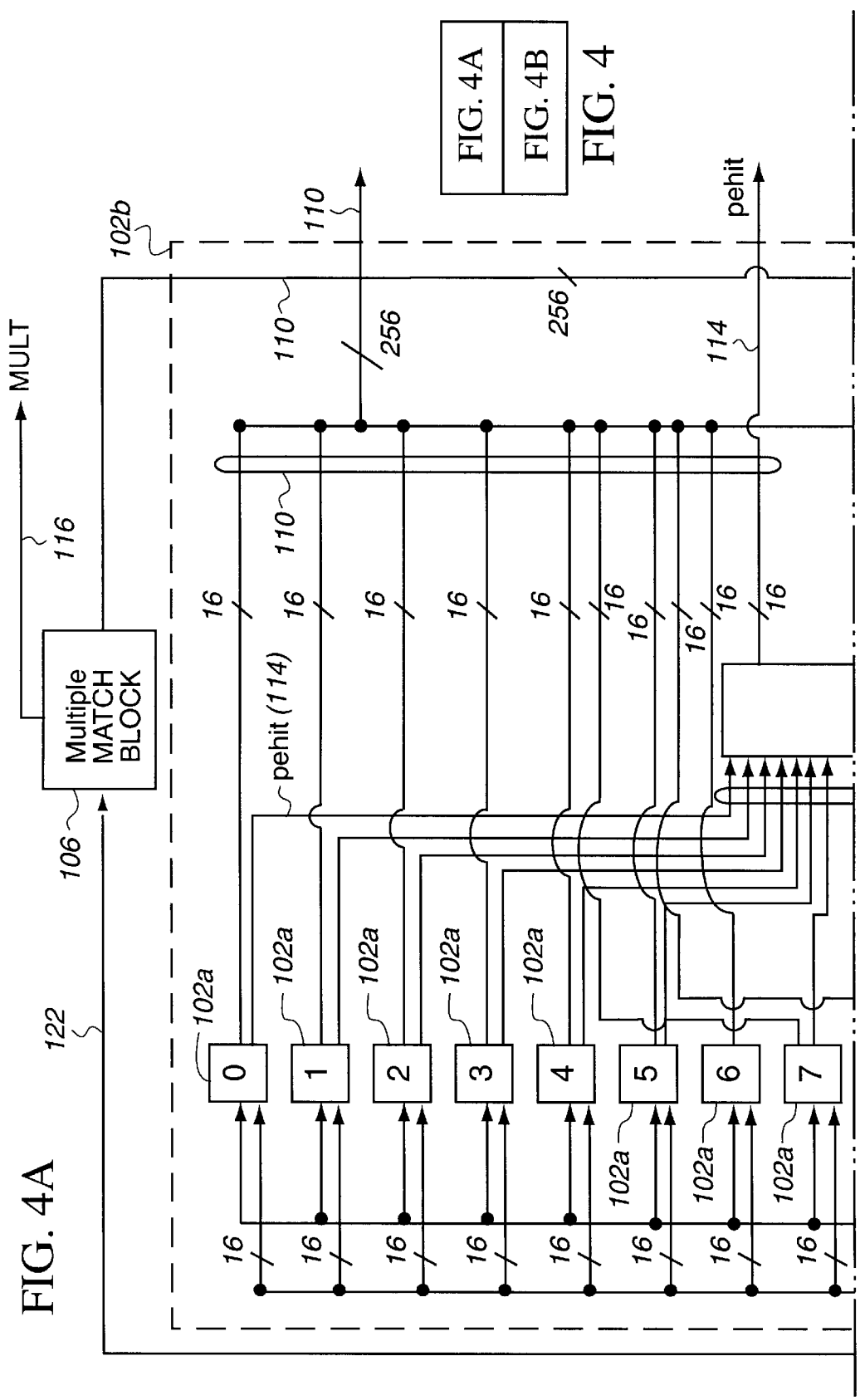

US 6,392,910 B1

PRIORITY ENCODER WITH MULTIPLE MATCH FUNCTION FOR CONTENT ADDRESSABLE MEMORIES AND METHODS FOR IMPLEMENTING THE SAME

CROSS REFERENCE TO RELATED APPLICATIONS

This application claims priority from U.S. Provisional Patent Application No. 60/153,388 filed Sep. 10, 1999, and entitled "Content Addressable Memory Circuitry." This provisional application is incorporated herein by reference.

BACKGROUND OF THE INVENTION

1. Field of the Invention

The present invention relates generally to memory circuits, and more particularly to priority encoders for content addressable memory (CAM) circuits.

2. Description of the Related Art

Modern computer systems and computer networks utilize memory devices for storing data and providing fast access to the data stored therein. A content addressable memory (CAM) is a special type of memory device often used for performing fast address searches. For example, Internet routers often include a CAM for searching the address of specified data. Thus, the use of CAMs allow routers to perform address searches to facilitate more efficient communication between computer systems over computer networks. Besides routers, CAMs are also utilized in other areas such as databases, network adapters, image processing, voice recognition applications, etc.

Conventional CAMs typically include a two-dimensional row and column content addressable memory core array of cells. In such an array, each row typically contains an address, pointer, or bit pattern entry. In this configuration, a CAM may perform "read" and "write" operations at specific addresses as is done in conventional random access memories (RAMs). However, unlike RAMs, data "search" operations that simultaneously compare a bit pattern of data against an entire list (i.e., column) of pre-stored entries (i.e., rows) can only be performed by CAMs.

FIG. 1A shows a simplified block diagram of a conventional CAM 10. The CAM 10 includes a data bus 12 for communicating data, an instruction bus 14 for transmitting instructions associated with an operation to be performed, and an output bus 16 for outputting a result of the operation. For example, in a search operation, the CAM 10 may output a result in the form of an address, pointer, or bit pattern corresponding to an entry that matches the input data.

Although conventional CAMs are becoming more powerful in their ability to perform searches more rapidly, each search can generate many search results that then need to be processed through a priority encoder (PE) to ascertain a match with the highest priority. Although there is a wide array of standard circuitry for completing priority encoding, as CAM memory arrays continue to grow in size and are required to operate at faster speeds, a PE must process more matches and also handle the generation of an address for a highest priority match in less time. In the prior art, attempts to address the need for speed and larger CAM arrays has been in increase the number of gates and complexity of the design. This solution has the downside of requiring more silicon area to layout the needed logic and also decreases cost.

Another downside of the prior art is that power consumption necessarily increases as the size of the PE design increases. The increased power consumption is generally due to the fact that PE designs require all of the logic blocks in different stages to turn ON, even when only one block in a given stage is actually contributing to the PE processing.

In view of the foregoing, what is needed is low power priority encoder circuitry that can provide increased performance for larger CAM arrays and can provide such increased performance in terms of speed with a design that requires less silicon area.

SUMMARY OF THE INVENTION

The present invention fills this need by providing CAM circuitry that includes a priority encoder that is scalable to meet a number of match line input configurations and is designed to intelligently operate in an efficient low power consuming manner. The priority encoder utilizes a multistage hierarchical architecture that ensures a high speed and low activity (low power) design. The priority encoder further utilizes a dynamic circuit layout so that chip area is conserved while maintaining the requirements of a high speed CAM. It should be appreciated that the present invention can be implemented in numerous ways, including as a process, an apparatus, a system, a device, or a method. Several embodiments of the present invention are described below.

In one embodiment, a priority resolver for use in a CAM circuit priority encoder is disclosed. The function of the priority resolver is to determine which of the N (where N is any integer greater than 2) matchline inputs are active and select the matchline with the highest priority (0 is highest priority and N is lowest priority). The output of the priority resolver is an N bit vector (called the resolved matchlines) with all outputs low (inactive) except for the output corresponding to the matchline with the highest priority. The priority resolver is also configured to generate global hit information, which is a logical OR function of all N matchline inputs. Additionally, the priority encoder is configured to generate a global model delay signal which mimics the worst case delay through the priority resolver, useful for controlling the high speed timing of the priority encoder. In this embodiment, the priority resolver includes one or more priority resolver sub-units which are connected in one or more stages. Each priority resolver sub-unit performs a similar function as the priority resolver, but on a smaller number of inputs.

When configured appropriately, the sub-units collectively perform the priority resolve function on the entire N matchlines inputs, and generate all the appropriate outputs of the priority resolver. Each priority resolver sub-unit can be configured to process M or more data inputs, where M (M is an integer greater than 1) is typically much less than N. The priority resolver circuit includes a dynamic OR circuit, local hit generation circuitry, a dynamic resolver circuit, a local model delay circuit, and an output differentiator and gating circuit. The dynamic OR circuit is configured to generate local hit information (pehit data). The local hit generation circuitry gates the input data with an enable signal and the pehit data. The local hit generation circuitry provides a way of saving power by reducing activity in the sub-unit. Also provided as part of a priority resolver sub-unit is a dynamic resolver circuit that is coupled to the local hit generation circuitry. The dynamic resolver circuit is configured to receive the outputs of the local hit generation circuitry and generate a resolved output vector.

Also included in the priority resolver sub-unit is a local model delay circuit which mimics the worst case delay through the sub-unit. The local model delay serves as a way for generating the global model delay signal of the priority resolver. An output differentiator and gating circuit is further provided as part of the priority resolver sub-unit and is configured to receive the output of the dynamic resolver circuit. The output differentiator and gating circuit serves as a way for minimizing common problems associated with dynamic circuits, which are spurious output transitions (due to input skew) and output skew. In this embodiment, the priority resolver sub-unit is implemented in one or more stages of the priority resolver, and each stage is configured to include one or more priority resolver sub-units. To reduce power only one (or at most only a few) priority resolver sub-units in each stage are configured to be activated by the enable signal.

In another embodiment, a priority resolver for use in a CAM circuit priority encoder is disclosed. The priority resolver includes one or more priority resolver sub-units. Each priority resolver sub-unit includes an local hit (pehit) generation circuitry. The local hit (pehit) generation circuitry is configured to generate pehit data. Also provided as part of a priority resolver sub-unit is a resolve processing circuit that is coupled to the local hit (pehit) generation circuitry. The resolve processing circuit is configured to receive the pehit data and an enable signal. An output differentiator and gating circuit is further provided as part of the priority resolver sub-unit and is configured to receive an output of the resolve processing circuit. In this embodiment, the priority resolver sub-unit is implemented in one or more stages of the priority resolver, and each stage is configured to include one or more priority resolver sub-units, in this embodiment however, only one priority resolver sub-unit in each stage is configured to be activated by the enable signal.

In yet another embodiment, a priority encoder is disclosed. The priority encoder includes: (a) a priority resolver that is configured to receive match line data, a priority encoder clock and generate a plurality of resolved match lines, a global model delay signal, and a pehit signal; (b) a priority encoder control block that is configured to receive a clock input, the global model delay signal from the priority resolver and generate a priority resolver master clock, a multiple match flop clock, a multiple match clock, an address encoder slave clock, and an address encoder sense clock; (c) a multiple match block that is configured to receive the match line data, the multiple match flop clock, a multiple match clock, and the plurality of resolved match lines from the priority resolver, and the multiple match block is configured to generate a MULT signal when multiple matches are detected; and (d) an address encoder that is configured to receive the plurality of resolved match lines, address encoder slave clock, address encoder sense clock, and is configured to communicate with the priority encoder control block and generate an address corresponding to the highest priority match input.

In still another embodiment, a priority resolver circuit is disclosed. The priority resolver circuit includes a first stage that has a first plurality of priority resolver sub-units. Each priority resolver sub-unit is configured to include local hit (pehit) generation circuitry, resolve processing circuitry, and output differentiator and gating circuitry. Further provided is a second stage that has a second plurality of priority resolver sub-units. In a third stage, a single priority resolver sub-unit is provided. In this embodiment, only one priority resolver sub-unit is configured to be active at one processing time in each of the first, second and third stages of the priority resolver circuit.

In another embodiment, a priority resolver circuit with N=4096 match line inputs is disclosed. The priority resolver includes a first stage with 256 priority resolver sub-units each having M=16 data inputs, a clock input, an enable input, a pehit output and M=16 data outputs. Each priority resolver sub-unit is configured to include local hit generation circuitry, local model delay circuitry, dynamic OR circuitry, and output differentiator and gating circuitry. Further provided is a second stage with 16 priority resolver sub-units each having M=16 data inputs, a clock input, an enable input, a pehit output and M=16 data outputs. In a third and final stage, a single priority resolver sub-unit is provided having M=16 data inputs, a clock input, an enable input, a pehit output and M=16 data outputs. In this embodiment, only one priority sub-unit in each stage is configured to be enabled to reduce power consumption. Alternate embodiments, include similar configurations but instead of enabling only one sub-unit per stage, all sub-units in any one stage are enabled. Enabling all sub-units in any one stage will boost performance at the expense of power. One reasonably skilled in the art, could determine that enabling the latter stages (with fewer sub-units) of the resolver is a good power versus performance trade-off. It is also apparent that one reasonably skilled in the art could conceive of alternate embodiments which include a heterogeneous mix of several different sub-units each varying in the parameter M.

The advantages of the present invention are numerous. Most notably, the priority resolver circuit is implemented in a multi-stage hierarchical architecture. The hierarchical architecture permits low power by enabling only a small number of priority resolver sub-units, but still maintains a high performance. In addition, the priority resolver employs low-power dynamic logic. The use of dynamic logic, as disclosed in the embodiments of the present invention, provide for high performance circuitry that can be compactly designed in silicon using less area. This advantage translates in reduced cost of manufacturing while providing the speed needed in today's CAM applications, such as Internet related equipment. Another advantage of the present invention is that each priority resolver sub-unit, in one embodiment, includes local hit (pehit) generation circuitry and output differentiator and gating circuitry. The local hit generation circuitry permits low power operation by enabling the resolve processing circuits when needed. The output differentiator and gating circuitry is designed to isolate the resolve processing circuits of each priority resolver sub-unit so as to prevent inadvertent turn-ons when the particular priority resolver sub-unit is not the active stage device. This implementation, as described in greater detail below, provides for superior power savings and enhanced speed over the prior art. It is also important to note that a priority encoder of the present invention preferably includes unique multiple match circuitry. This multiple match circuitry is designed to compare resolved match line data and unresolved match line data and then rapidly indicate when multiple matches exist. In combination, the disclosed embodiments provide for a powerful priority encoder circuit that can significantly improve the performance of address generation in CAM circuits and their end-product implementation (e.g., routers).

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for CAM circuitry is provided. The CAM circuitry includes a priority encoder that is scalable to meet a number of match line input configurations and is designed to intelligently operate in an efficient low power consuming mode. The priority encoder further utilizes a dynamic circuit layout so that chip area is conserved while maintaining the requirements of a high speed CAM. The efficiency and intelligence provided by the CAM circuitry therefore facilitates efficient data processing in search dependent technologies, such as network and Internet communication systems. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
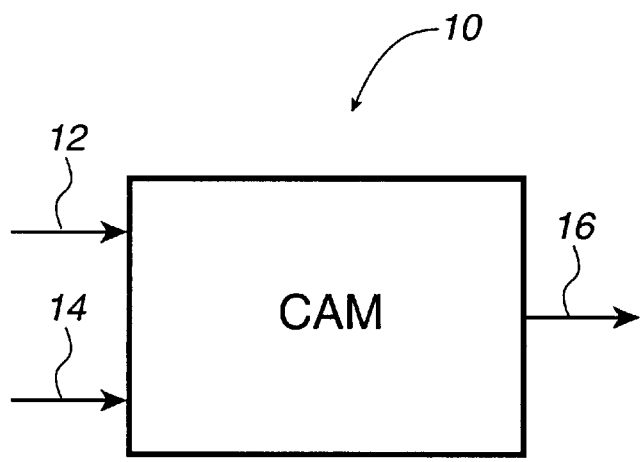
FIG. 1A shows a simplified block diagram of a conventional CAM.
Figure 1B:
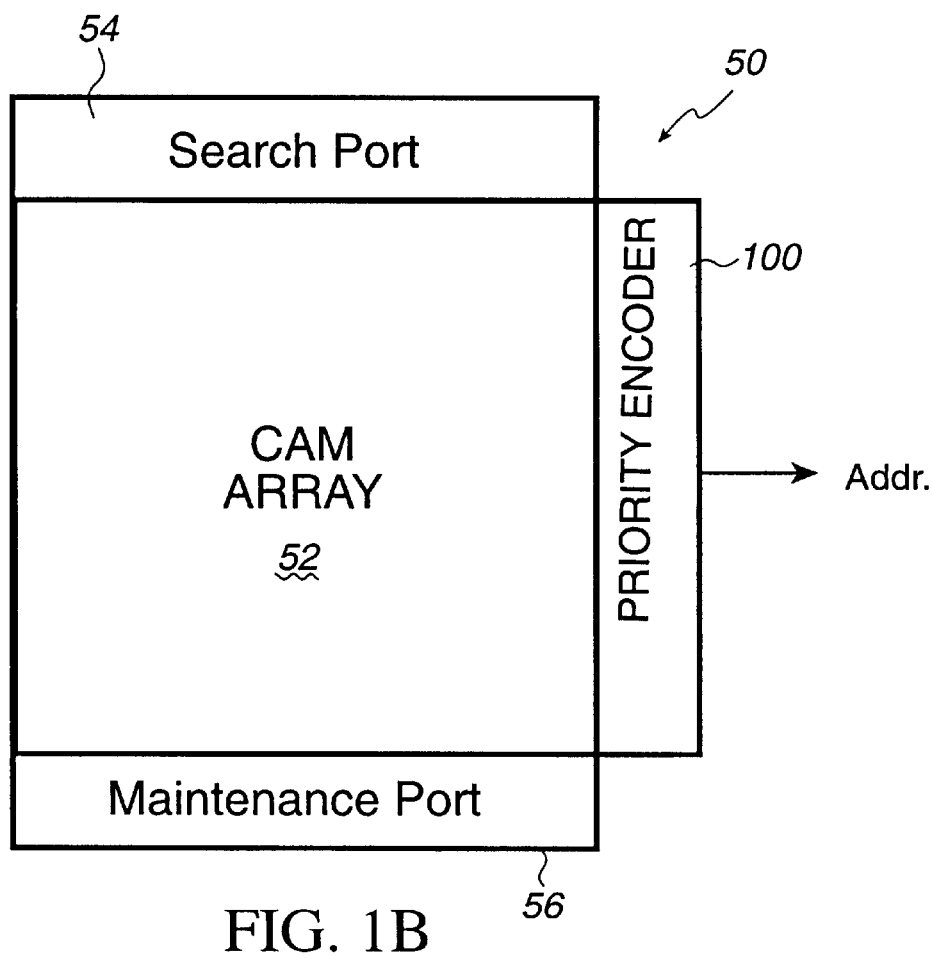
FIG. 1B shows a high level block diagram of a content addressable memory (CAM) system.

FIG. 1B shows a high level block diagram of a content addressable memory (CAM) system 50. The CAM system 50 includes a CAM array 52 and an associated search port 54 and a maintenance port 56. In operation, the CAM array 52 will generate match line data to a priority encoder 100 so that an address (Addr.) corresponding to the highest priority match can be determined for the data being searched.

Figure 2:
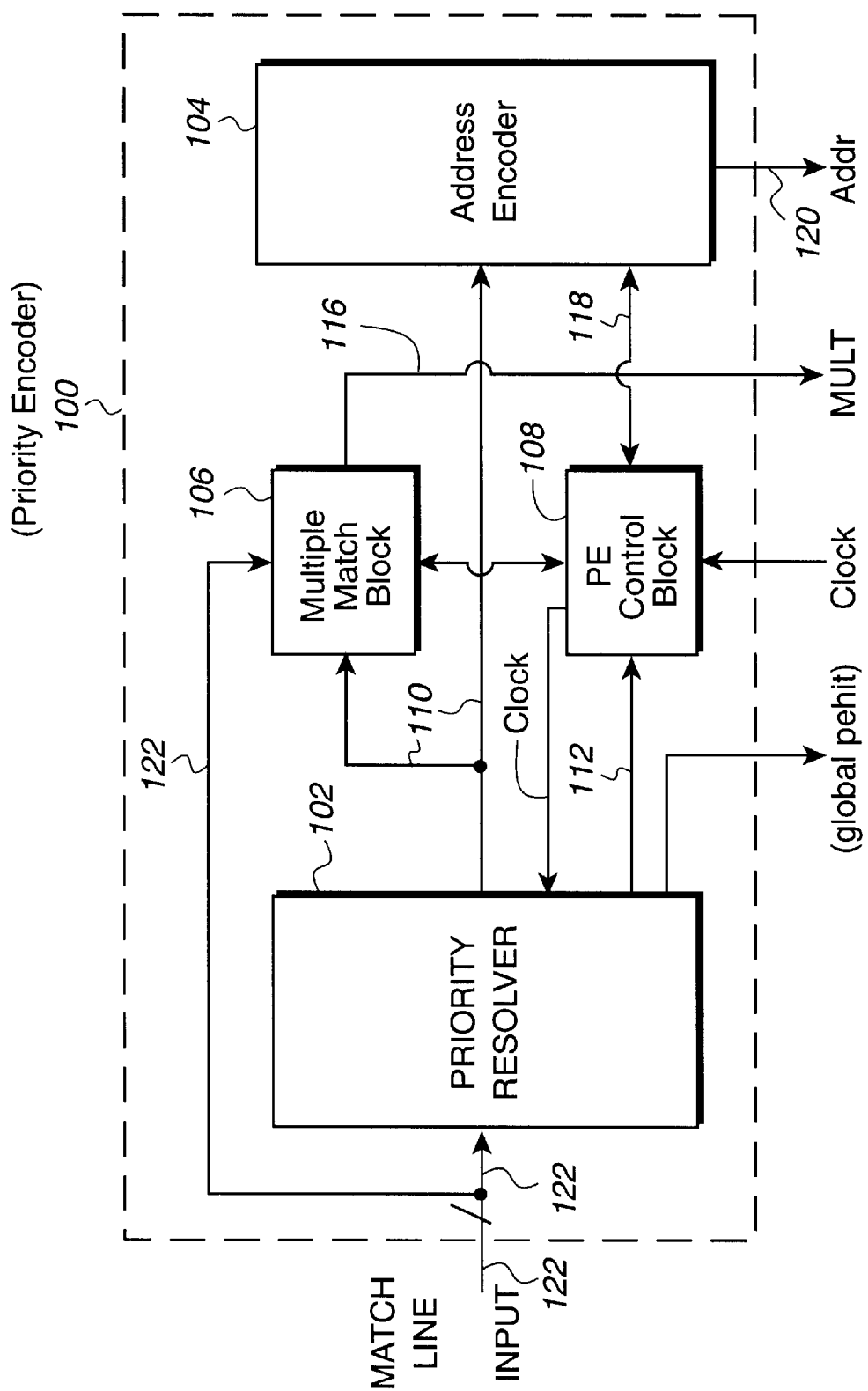
FIG. 2 shows a high level block diagram of a priority encoder, in accordance with one embodiment of the present invention.

FIG. 2 shows a high level block diagram of a priority encoder 100, in accordance with one embodiment of the present invention. The priority encoder 100 generally includes a priority resolver 102, and an address encoder 104 that is configured to generate the address (Addr) 120 of the highest priority match. In this embodiment, the priority encoder 110 is further configured to include a multiple match block 106 and a priority encoder (PE) control block 108. As shown, the priority encoder 100 is configured to receive match line inputs 122 at the priority resolver 102. The match line inputs 122 are also communicated to the multiple match block 106. The priority resolver 102 will then output resolved match line data 110 to both the multiple match block 106 and the address encoder 104. The priority resolver 102 will further output a model delay path 112 to the priority encoder control block 108. Also shown is a global pehit signal which is indicative of the existence of more than zero active match lines within 122 the priority resolver 102.

The multiple match block 106 is configured, as shown, to receive the resolved match line 110 and the match line inputs 122, and then output a MULT signal 116. The MULT signal 116 is configured to indicate that there is more than one active match lines 122 coming from the CAM array 52. The address encoder 104 is configured to receive the resolved match line data 110 as well as signals coming from the priority encoder control block 108 to produce an address (Addr.) that is associated with the match having the highest priority.

As memory devices continue to grow in storage capacity, and the speed requirements also correspondingly increase, there is a need to produce priority encoders that are capable of rapidly generating a result within a certain time constraint. For example, 100 MHz CAM systems 50 may require that match resolving operations be performed within about 10 nanoseconds. Accordingly, as the speed requirements continue to grow, there will be a continual need to produce rapid address generation within shorter and shorter time constraints. In accordance with one embodiment of the present invention, the priority resolver 102 is configured to rapidly produce resolved match lines 110 using a dynamic logic arrangement that uses substantially less power, using substantially fewer transistors than non-dynamic arrangements, and at much faster speeds than conventional devices.

Figure 3A:
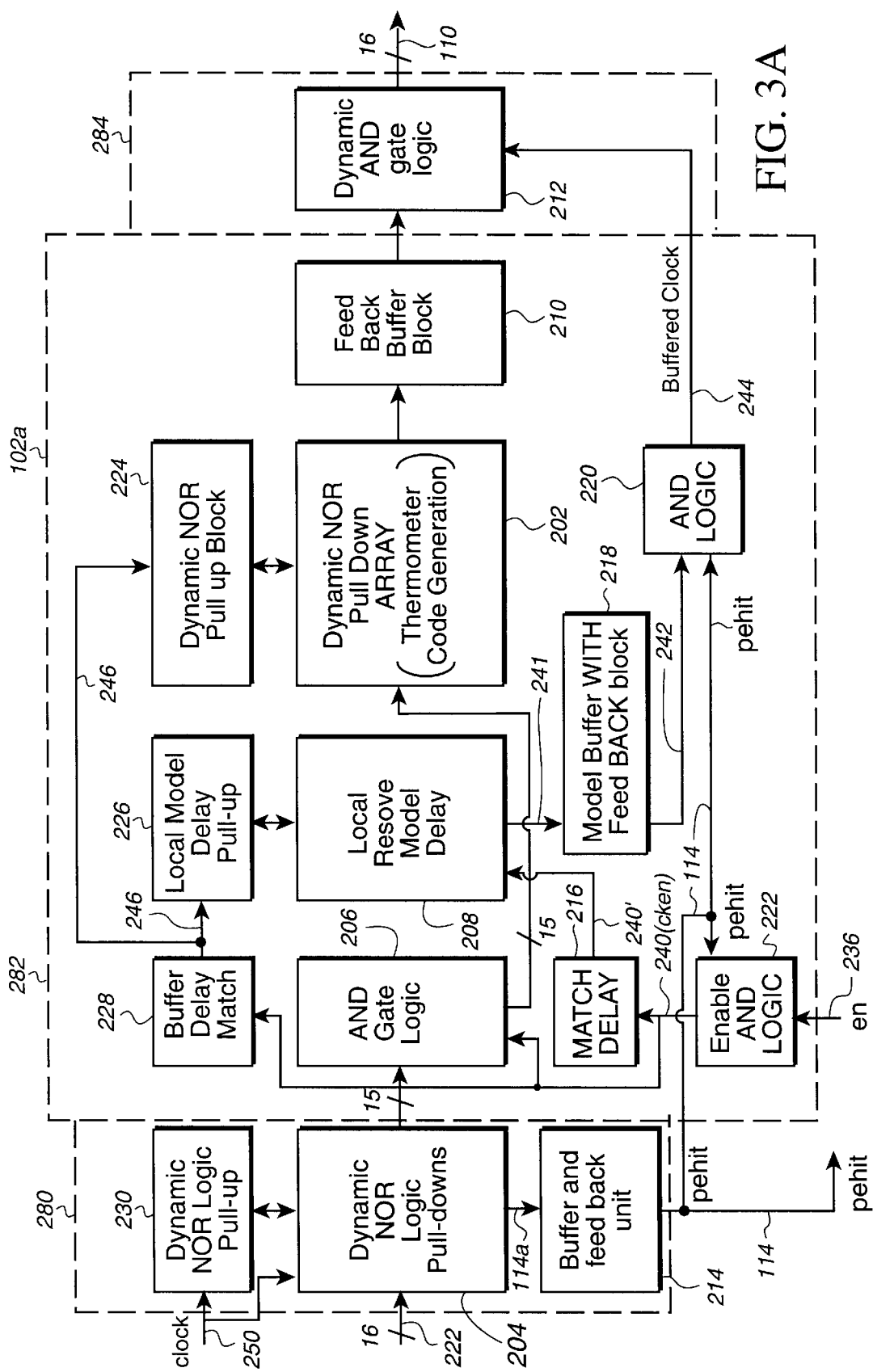
FIG. 3A shows a block diagram of a priority resolver sub-unit that is resident within the priority resolver of FIG. 2, in accordance with one embodiment of the present invention.
Figure 4B:
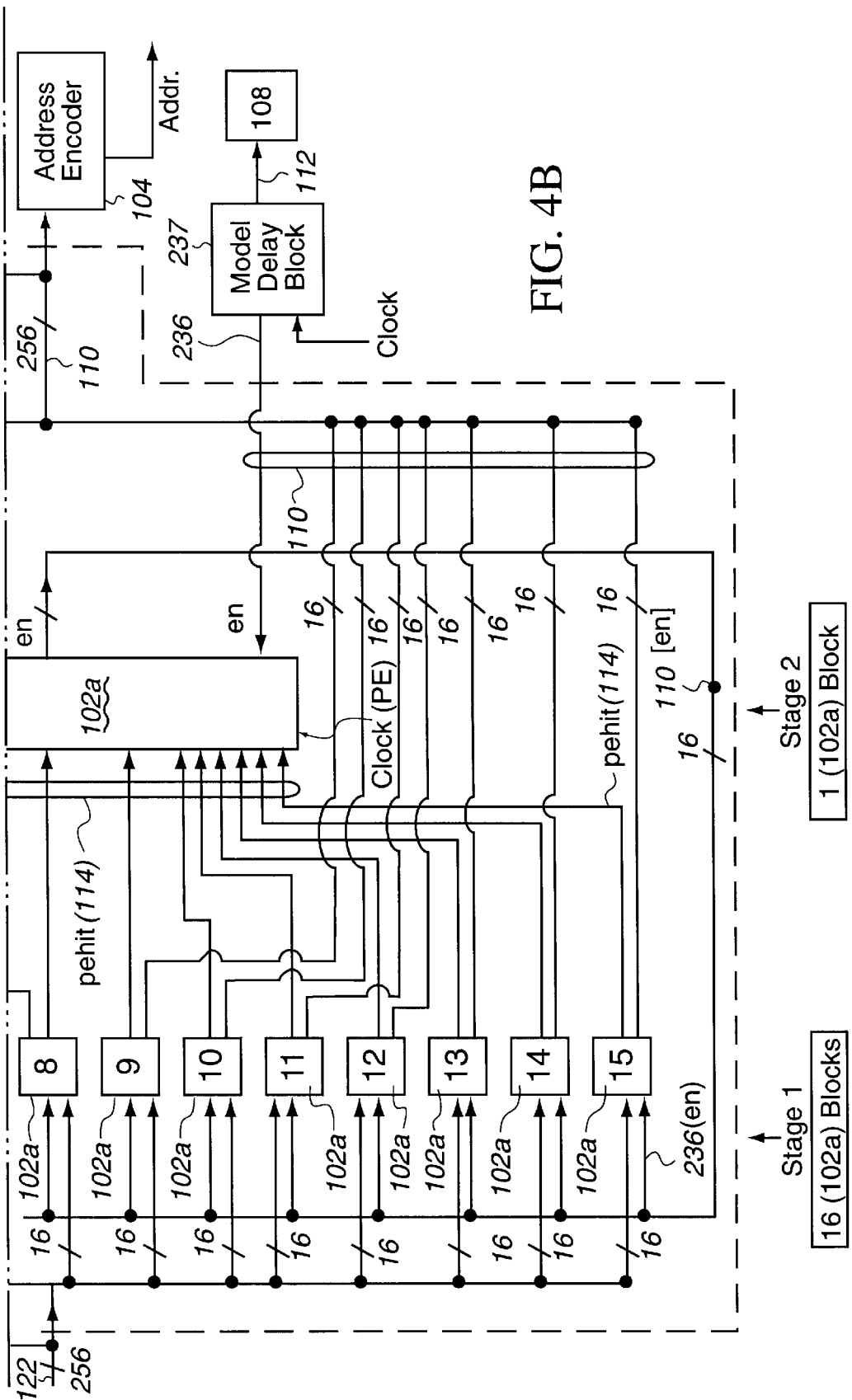
FIG. 4 shows a block diagram of a priority resolver multi-stage unit, in accordance with one embodiment of the present invention.

With this in mind, FIG. 3A shows a block diagram of a priority resolver sub-unit 102a that is resident within the priority resolver 102 of FIG. 2. As will be described in greater detail below, the priority resolver 102 is configured to include one or more stages of priority resolver sub-units 102a. For instance, if the CAM array 52 is configured with N=256 match lines, the priority resolver 102 with M=16 will be configured to include two stages of priority resolver sub-units 102a. The first stage will include 16 priority resolver sub-units 102a as shown in FIG. 4, and a second stage including a single priority resolver sub-unit 102a.

Figure 5:
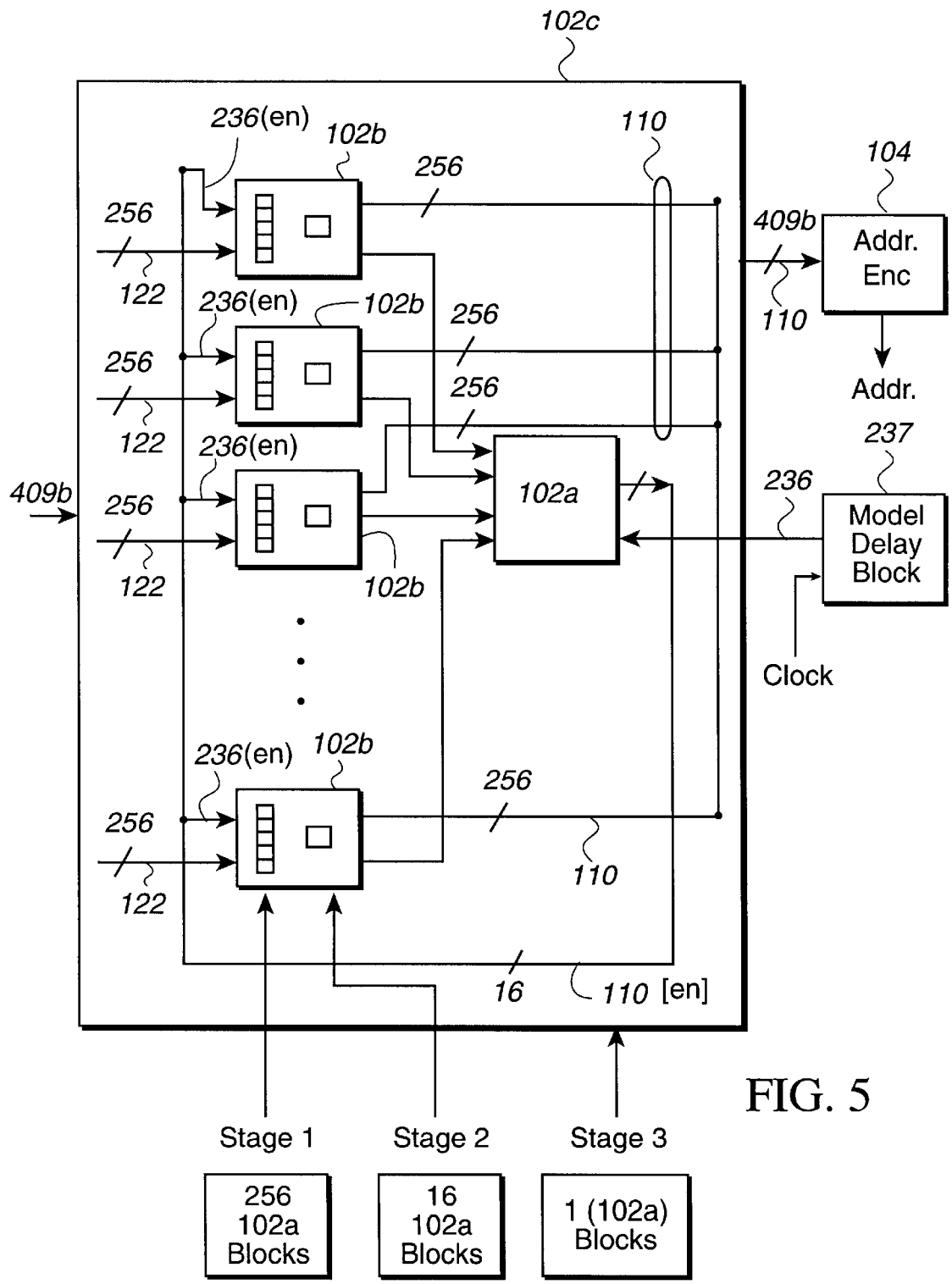
FIG. 5 shows a high level block diagram of a priority resolver tri-stage unit, in accordance with one embodiment of the present invention.

However, if the CAM array is configured to produce N=4K (e.g., 4096 match lines) match lines, the priority resolver 102 with M=16 will include 3 stages of priority resolver sub-units 102a. This arrangement is shown in FIG. 5. As shown therein, the first stage will include 256 priority resolver sub-units 102a, the second stage will include 16 priority resolver sub-units 102a, and the third stage will include 1 priority resolver sub-unit 102a. With this overview in mind, the contents of a single priority resolver sub-unit 102a will now be described. As shown, the priority resolver sub-unit 102a, as described from left to right, includes local hit (pehit) generation circuitry 280, resolve processing circuitry 282, and output differentiator and gating circuitry 284. In one embodiment, the local hit (pehit) generation circuitry 280 includes a dynamic NOR logic pulldowns 204. The dynamic NOR logic pulldowns 204 is configured to receive 16 match lines. A dynamic NOR logic pull-ups 230 is also provided and is configured to receive a clock signal 250. The match lines 122 are configured to be received from the CAM array 52 as described with reference to FIG. 1B.

The dynamic NOR logic pulldowns 204 are coupled to a buffer and feedback unit 214. The buffer and feedback unit 214 is configured to receive a negated pehit signal (i.e., pehitn) 114a that is generated by the dynamic NOR logic pulldowns 204. The pehit signal 114 is configured to be routed to a next priority resolver sub-unit 102a. However, if the priority resolver sub-unit 102a is in the last stage of the priority resolver 102, the pehit 114 represents the global hit for the entire priority encoder, and may be fed back into the en input of itself. Alternatively, the en input of the last stage priority resolve element 102a, may be configured to receive a model delay path from a model delay block 237 as shown in FIG. 3C. Also shown in FIG. 3A is the pehit signal 114 being routed to an enable AND logic 222 as well as an AND logic 220. The enable AND logic 222 is also configured to receive an enable (en) signal 236. The enable AND logic 222 is designed to produce a clock enable (cken) 240 when the priority resolver sub-unit 102a is selected to be active. The clock enable signal 240 is then communicated to a match delay block 216, and a buffer delay match 228 and the AND gate logic 206. The match delay block 216 will then communicate a delayed cken signal 240' to a local model resolve delay 208. The buffer delay match communicates a signal 246 to a local model delay pull-up 226, and the dynamic NOR pull-up.

The local model delay pull up 226 is in communication with the local resolve model delay 208. The AND gate logic 206 is shown in communication with the dynamic NOR pull down array 202 which is also coupled to the dynamic NOR pull up block 224. The dynamic NOR pull down array 202 is configured to include the pull down logic for 16 different sized dynamic NOR gates, to produce a thermometer code result (thermometer coding represents the set of all bit strings whose prefix is all 1's and remaining bits set to 0, conversely, thermometer coding also represents the set of all bit strings whose prefix is all 0's and remaining bits set to 1). This dynamic NOR pull down array 202 will therefore enable the fabrication of more densely arranged priority resolver 102 circuits. That is, the priority resolver 102 can be laid out with fewer transistors, yet produce higher performance functionality in a low power consuming manner. It should be noted that the dynamic NOR pull down array 202 can be designed using other transistor circuitry other than dynamic NOR gates so long as the thermometer code generation functionality is preserved. The functionality of the dynamic NOR pull down array 202 will be described in greater detail below with reference to FIG. 3D.

Continuing with the discussion of FIG. 3A, the dynamic NOR pull down array 202 then feeds to a feedback buffer block 210 and then to a dynamic AND gate logic block 212. The dynamic AND gate logic 212 will then be configured to generate the resolved match line output 110 that is communicated to the address encoder. Of course, it should be understood that the priority resolver sub-unit 102a represents only a single priority resolver sub-unit of the priority resolver 102 of FIG. 2. As mentioned above, the priority resolver 102 will preferably be comprised of two or more stages, depending upon the parameter M (the number of match line inputs 122), and upon the size of the CAM memory array for which the priority encoder 100 is designed.

Figure 3B:
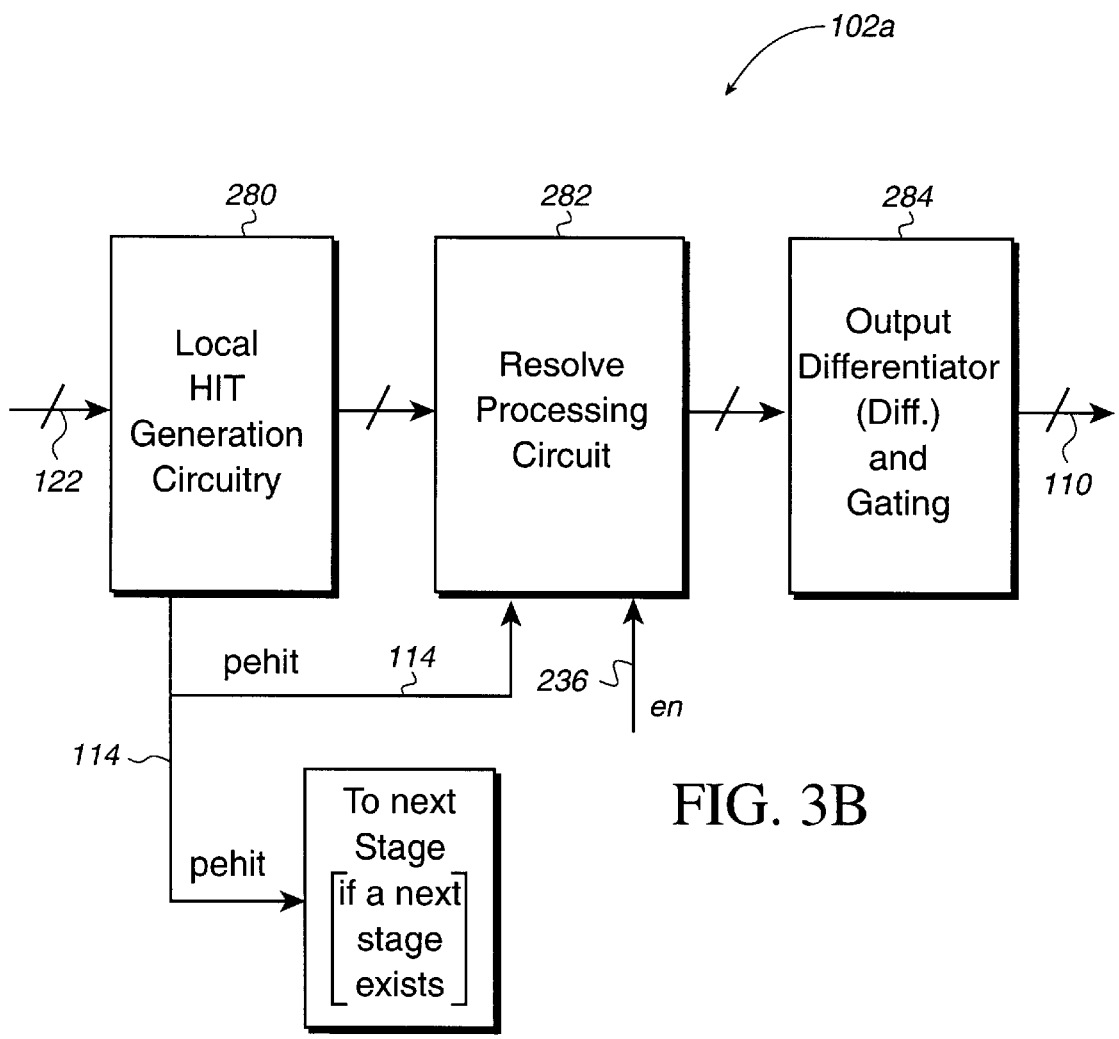
FIG. 3B shows a higher level block diagram of FIG. 3A.
Figure 3C:
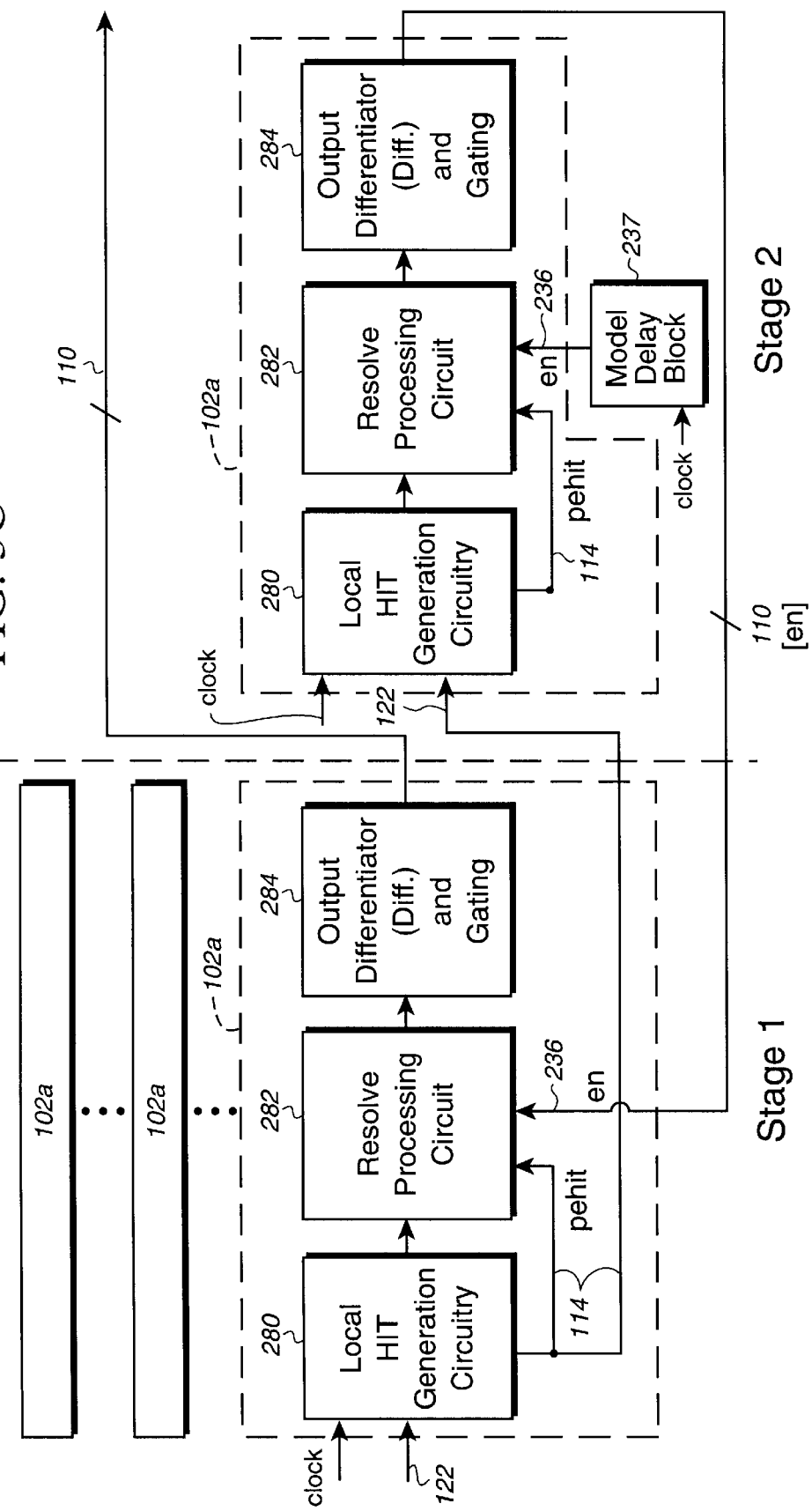
FIG. 3C shows a two-stage priority resolver in which a first stage includes a plurality of priority resolver sub-units, and the second stage includes a single priority resolver sub-unit, in accordance with one embodiment of the present invention.

FIG. 3B shows a higher level block diagram of FIG. 3A. As described above, the priority resolver sub-unit 102a is broadly configured to include a local hit (pehit) generation circuitry 280, a resolve processing circuit 282, and an output differentiator and gating circuit 284. The local hit (pehit) generation circuitry 280 is configured to include, in one embodiment, the dynamic NOR logic pull-ups 230, the dynamic NOR logic pulldowns 204, and the buffer and feedback unit 214. Therefore, the local hit (pehit) generation circuitry 280 will be configured to generate the pehit data signal 114. As shown, the pehit data signal 114 is routed to the resolve processing circuit 282 as well as to a next stage. If there is no next stage and the priority resolver sub-unit 102a is the last stage in the priority resolver circuit, then the pehit is not routed to a next stage, but instead is used to generate the global hit for the entire priority resolver.

Also shown is the enable signal 236 (en) that is fed into the resolve processing circuit. In this embodiment, the resolve processing circuit 282 is configured to include the AND gate logic 206, the local resolve model delay 208, the dynamic NOR pull down array 202, the feedback buffer block 210, the match delay block 216, the enable AND logic 222, the model buffer with feedback block 218, and the AND logic 220. The output differentiator and gating circuit 284 is configured to include the dynamic AND gate logic 212 as shown in FIG. 3A.

FIG. 3C shows a two-stage priority resolver in which a first stage includes a plurality of priority resolver sub-units 102a (e.g., 16 priority resolver sub-units 102a), and the second stage includes a single priority resolver sub-unit 102a. For simplicity, only one priority resolver sub-unit 102a of stage 1 will be shown interconnected with the second stage priority resolver sub-unit 102a. For more complete understanding of the routing between a plurality of first stage priority resolver sub-units 102a and a single priority resolver sub-unit 102a of a second stage, reference may be made to FIG. 4 below.

Returning to FIG. 3C, the exemplary priority resolver sub-unit 102a of the first stage is shown communicating its pehit data signal 114 to both the resolve processing circuit 282 of itself as well as an input to the local hit (pehit) generation circuitry 280 of the second stage priority resolver sub-unit 102a. Accordingly, the pehit data signals 114 that are routed to the second stage will act as the match line inputs 122 of the first stage. The resolved match lines 110 of the first stage are all communicated to the output of the priority resolver as shown in FIG. 2, and thus communicated to the multiple match block 106, and the address encoder 104. Because in stage 2 the priority resolver sub-unit 102a is the last stage, the pehit data signal 114 is communicated to the resolve processing circuitry 282 and this serves to generate the global hit information. The enable signal for the second stage will not be generated from a next stage, but will be generated by a model delay block 237.

As will be described in greater detail below, the model delay block 237 is configured to incorporate model dummy priority resolver sub-unit circuits 102a, totaling the number of stages in the priority resolver 102. As described below, stage 1 of the priority resolver includes a plurality of priority resolver sub-units 102a, while the second stage only includes one priority resolver sub-unit 102a. During operation, the resolve processing circuit 282 of each stage will remain in the inactive state until it is enabled to process match line inputs 122 to generate resolved match line data 110. Specifically, in the first stage, there will be 16 priority resolver sub-unit 102a circuits and only one of the priority resolver sub-units 102a in the first stage will be activated when the proper enable signal 110 is propagated back to the first stage in the form of the enable 236. Of course, the resolve processing circuitry of the last stage will also be enabled each time by the model delay block 237. In alternative embodiments, it is not necessary for the enable of the first stage to come from the next stage output 110. In such alternative embodiments, it is possible to include another model delay block 237 to enable the first stage, for example. In yet another alternate, the pehit signal 114 of 102a can feedback to the input 236.

There is significant power savings in this arrangement since it is not necessary to activate the resolve processing circuit 282 of each of the 16 priority resolver sub-units 102a of the first stage. That is, only one resolve processing circuit 282 in the first stage will be activated and depends on the resolved match line outputs 110 of the second stage. The power savings is even more dramatic when a three-stage device is presented. In a three-stage device (which will be described in greater detail with reference to FIG. 5), the first stage will include 256 priority resolver sub-units 102a, the second stage will include 16 priority resolver sub-units 102a, and the third stage will include a single priority resolver sub-unit 102a (similar to that of stage 2 in FIG. 3C).

In operation, the fed back signals 110 which are fed into the enable signal 236 of the resolve processing circuits 282 in each of the first and second stages will be configured to select only one priority resolver sub-unit 102a in each stage. That is, for a three-stage device, only one priority resolver sub-unit 102a will be selected from all 256 priority resolver sub-units 102a in the first stage. In the second stage, only one priority resolver sub-unit 102a will be selected, and in the third stage, which is the last stage, the priority resolver sub-unit 102a will be activated by model delay path 237.

Figure 3D:
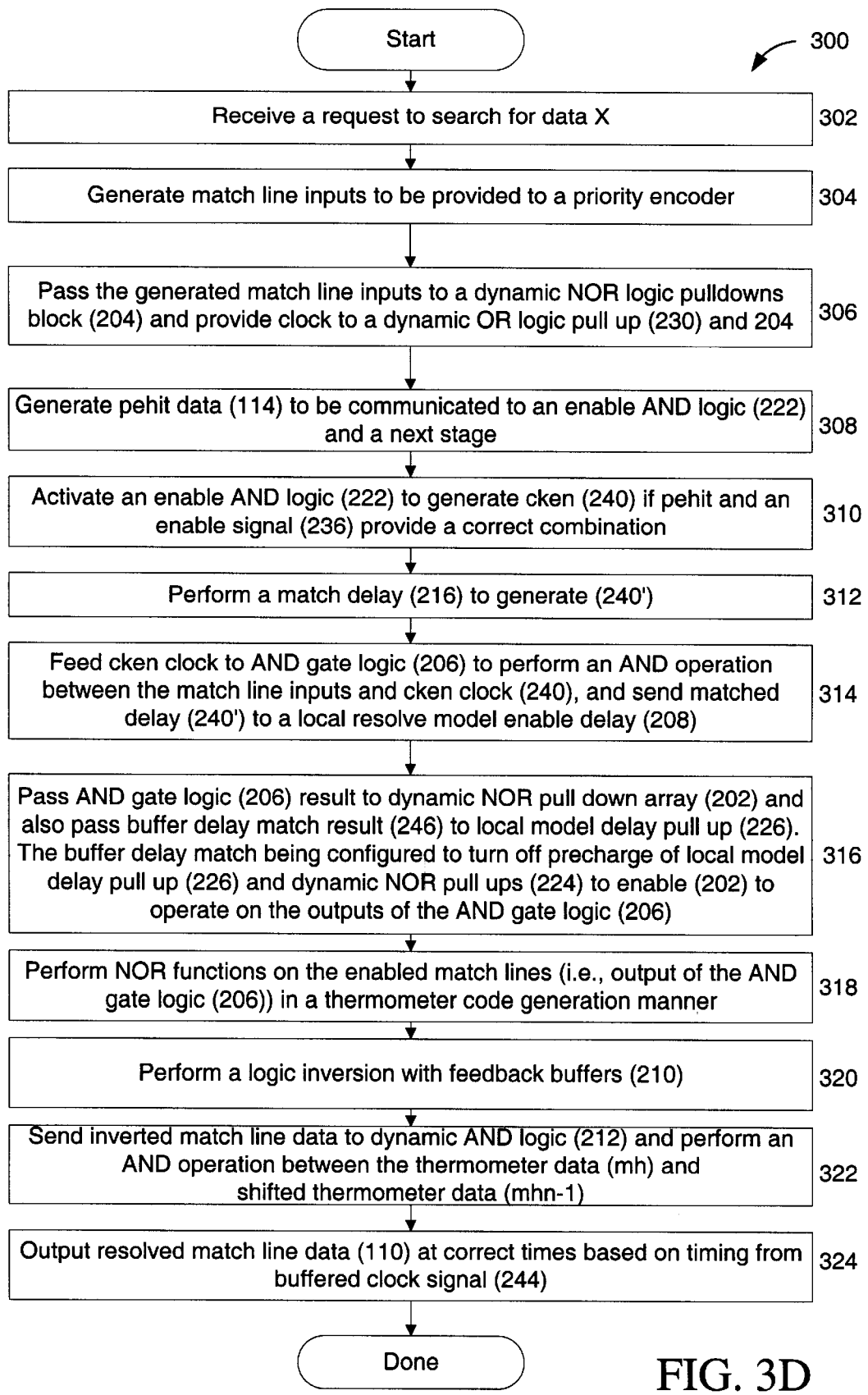
FIG. 3D illustrates a flowchart diagram that describes exemplary interaction between components of a single priority resolver sub-unit of FIG. 3A, in accordance with one embodiment of the present invention.

FIG. 3D illustrates a flowchart diagram 300 that describes exemplary interaction between components of a single priority resolver sub-unit 102a of FIG. 3A, in accordance with one embodiment of the present invention. The method begins at an operation 302 where a requested search for data X is received. The method then moves to operation 304 where match line inputs to be provided to a priority encoder are generated by the CAM array 52 of the CAM system 50. Now, the generated match line inputs are passed to a dynamic NOR logic pulldowns 204 and clock is provided to a dynamic NOR pull-ups 230 in operation 306. Pehit data 114 is then generated and communicated to a next stage and an enable AND logic 222. However, if the priority resolver sub-unit 102a is the last stage, the pehit data 114 signal will be fed back to the enable AND logic 222 and serve as a means for generating the global hit information (114 on FIG. 2).

In operation 310, the enable AND logic 222 will activate to generate cken (240) if the pehit data 114 and the enable signal 236 are proper. That is, if the priority resolver sub-unit 102a is not the last stage, the enable signal 236 will be provided from the output 110 of the next stage. Only one of the signals 110 will be configured to activate one of the priority resolver sub-units 102a in the given "non-last" stage. Assuming that the priority resolver sub-unit 102a of FIG. 3A is to be activated, the method will move to operation 312 where a match delay is performed by the match delay block 216 to generate cken 240'. Once the match delay has been performed, the method moves to operation 314 where cken clock (240) is fed into AND gate logic 206 to perform an AND operation between the match line inputs and the cken clock. The match delay clock (240') from the match delay block 216 is sent to the local resolve model delay 208. In operation 316, the AND gate logic 206 result is passed to dynamic NOR pull down array 202, and the buffer delay match is passed to a local model delay pull up 226.

The buffer delay match is configured to turn OFF precharge of local model delay pull up 226 and dynamic NOR pull ups 224 to enable the dynamic NOR pull down array 202 to operate on the outputs of the AND gate logic 206. At this point, the method moves to operation 318 where multiple NOR functions are performed on the enabled match lines (i.e., the output of the AND gate logic 206), in a thermometer code generation manner. In operation 320, a logic inversion is performed with feedback buffers 210. Then, in operation 322, the inverted match line data is sent to dynamic AND logic 212 where an AND operation is performed between thermometer code data (mh) and shifted thermometer code data (mhn−1) to differentiate the thermometer code value and determine the resolved match lines data 110. The process of AND'ing these two values is commonly referred to as the differentiation of thermometer code data. These signals are shown in greater detail in FIG. 3E below. At this point, in operation 324, resolve match line data 110 is output at correct times based on timing from the buffered clock signal 244 coming from AND logic 220. As discussed above, AND logic 220 is fed with pehit data 114 as well as the delayed cken signal 242.

Figure 3E:
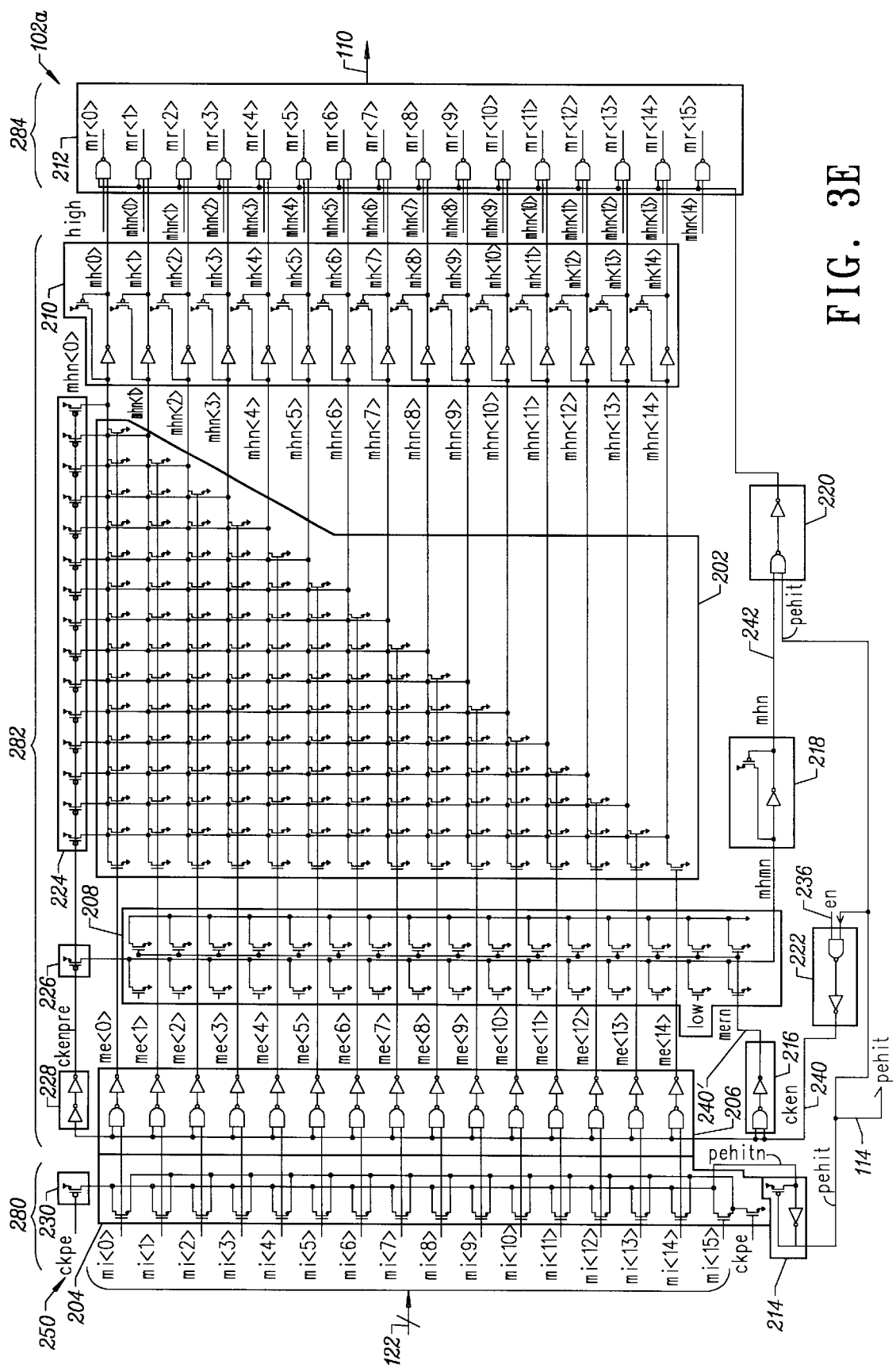
FIG. 3E is a more detailed circuit diagram of a single priority resolver sub-unit, in accordance with one embodiment of the present invention.

FIG. 3E is a more detailed circuit diagram of a single priority resolver sub-unit 102a, in accordance with one embodiment of the present invention. For completeness, each block of circuitry and logic can be mapped back to FIG. 3A. Although the specific circuit elements are shown by way of FIG. 3E, it should be understood that logic circuitry can be configured in many ways and with alternative gates and logic to achieve the same function. Thus, the actual gates and logic elements are only provided as an example circuit configuration.

FIG. 4 shows a block diagram of a priority resolver multi-stage unit 102b, in accordance with one embodiment of the present invention. The priority resolver multistage unit 102b includes a plurality of priority resolver sub-units 120a. In this example, the priority resolver multi-stage unit 102b includes a first stage of priority resolver sub-units 102a, and a second stage of priority resolver sub-units 102a. The first stage includes 16 priority resolver sub-units 102a, and the second stage includes a single priority resolver sub-unit 102a. The priority resolver multi-stage unit 102b is thus configured to receive 256 match lines 122 and then communicate 16 match lines to each of the priority resolver sub-units 102a in the first stage.

Each of the first stage priority resolver sub-units 102a is also configured to receive the resolved match line output 110 from the second stage priority resolver sub-unit 102a, and provided as an enable input (en). Although not shown, each of the priority resolver sub-units 102a is configured to receive a clock. The output from each of the priority resolver sub-unit 102a from the first stage is also configured to produce pehit 114 signals that are fed to the match line inputs of the second stage priority resolver sub-unit 102a. Each of the priority resolver sub-units 102a of the first stage are also configured to produce 16 resolved match line signals 110 which are communicated as 256 resolved match line outputs 110 to the address encoder 104. This example assumes that the priority resolver multi-stage unit 102b is configured to service a memory having the capability of generating 256 match lines. Of course, if the memory is of a larger size, a plurality of priority resolver multi-stage units 102b can be implemented as shown in FIG. 5.

In the case where the priority resolver 102 is configured to have only two stages, the second stage priority resolver sub-unit 102a will be configured to receive an enable signal 236 from a model delay block 237. The model delay block, as will be described in greater detail below, is configured to generate the enable to trigger the priority resolving function for a given search. Also shown is the second stage priority resolver sub-unit 102a generating pehit data 114. The resolved match line data 110 is also communicated to a multiple match block 106 that also receives the match line inputs 122. The multiple match block, as described with reference to FIG. 2, is configured to generate a MULT signal 116. The MULT signal 116, when generated, is configured to indicate that there is more than one active match line. The model delay block 237 is also shown configured to generate a signal 112 to the PE control block 108 as described with reference to FIG. 2.

FIG. 5 shows a high level block diagram of a priority resolver tri-stage unit 102c, in accordance with one embodiment of the present invention. The priority resolver tri-stage unit 102c is configured to receive 4K (4096) match lines and then process them through three stages of priority resolver sub-units 102a before being output to the address encoder 104. In this example, the first stage includes 16 priority resolver multi-stage units 102b. As described above with reference to FIG. 4, each of the priority resolver multi-stage units 102b will include 16 priority resolver sub-units 102a in the first stage, and a single priority resolver sub-unit 102a in the second stage. Accordingly, there will be 256 priority resolver sub-units 102a in the first stage of 102c, 16 priority resolver sub-units 102a in the second stage of 102c, and a single priority resolver sub-unit 102a in the third stage of the priority resolver tri-stage unit 102c. The output of the priority resolver tri-state unit 102c will then be communicated to the address encoder 104 and other blocks as described with reference to FIG. 2.

Figure 6:
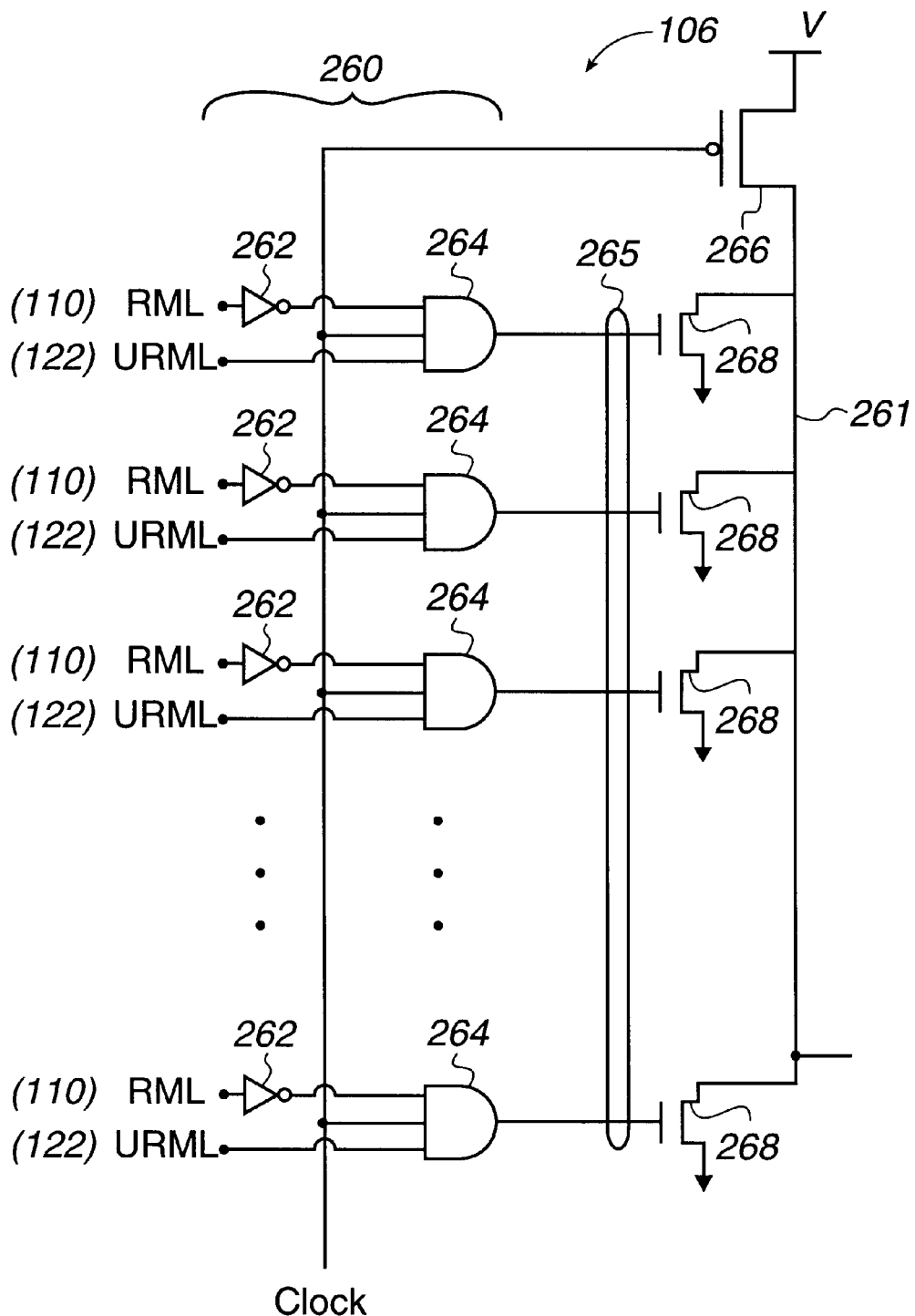
FIG. 6 shows a partial circuit diagram of the multiple match block, as shown in FIGS. 2 and 4, in accordance with one embodiment of the present invention.

FIG. 6 shows a partial circuit diagram of the multiple match block 106, as shown in FIGS. 2 and 4, in accordance with one embodiment of the present invention. As shown, the multiple match block 106 will include as inputs, resolved match lines (RML) 110, and unresolved match lines (URML) 122. The multiple match block 106 includes pairs of AND gates 264 and inverters 262. The inverters 262 are configured to receive the resolved match lines 110 and the AND gates 264 are configured to receive the unresolved match lines 122 and the output of the inverters 262. The AND gates 264 are also coupled to clock, and clock is also coupled to a P-channel device 266. P-channel device 266 has one node connected HIGH to a voltage source and the other node coupled to nodes of transistors 268 to form a wired NOR function. The gates of transistors 268 are each coupled to signals 265. Each signal 265 is defined as the output of respective AND gates 264.

In operation, when clock goes HIGH, logic 260, which includes the inverters 262 and AND gates 264, is activated. This function detects if any resolve match line is LOW and its corresponding unresolved match line is HIGH. When this is the case, the output signal 265 is forced HIGH and thus drives line 261 to ground. When line 261 is driven to ground, this indicates the presence of a multiple match (i.e., more than one match).

Figure 7:
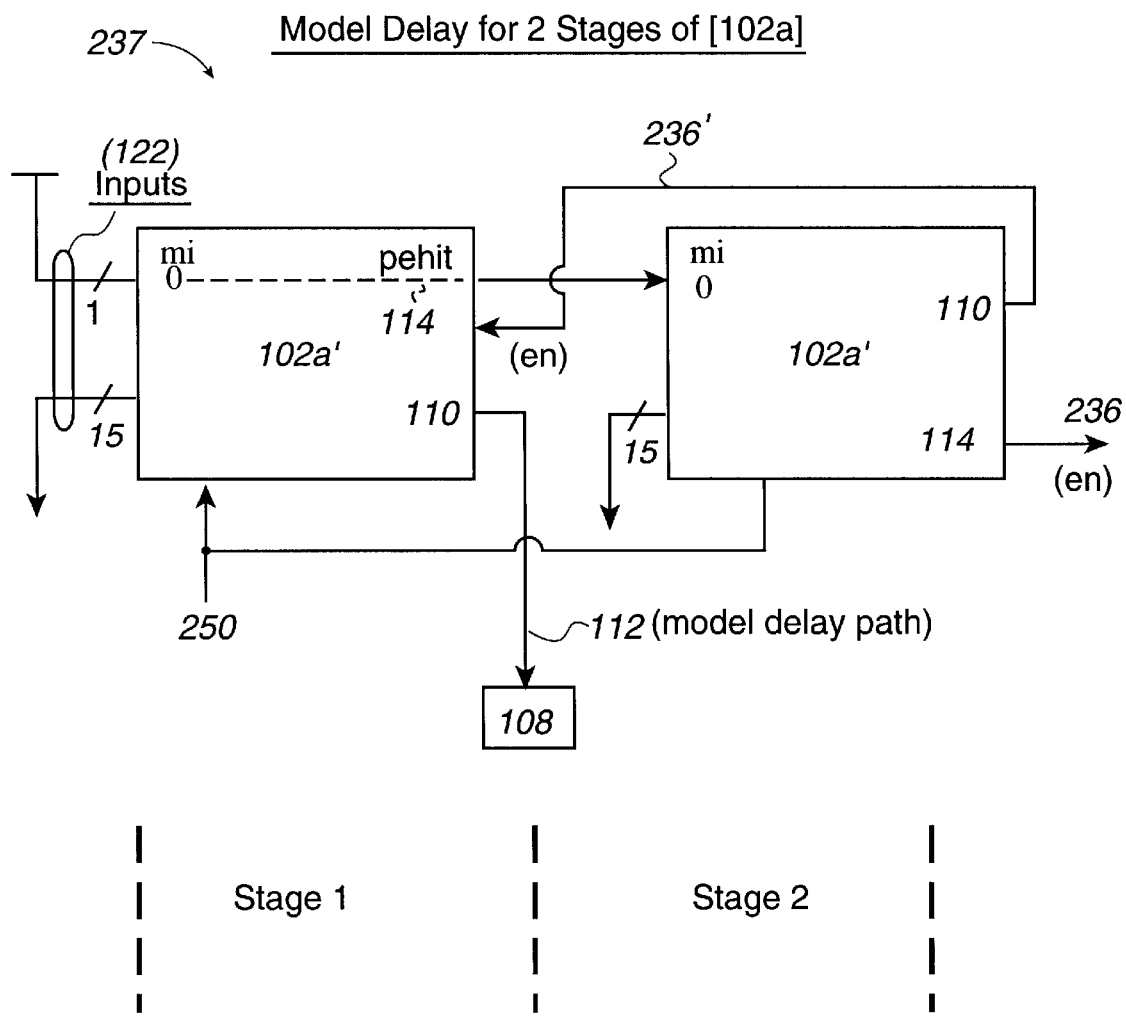
FIG. 7 illustrates in more detail a model delay block which is designed to model the delay for a priority resolver having two stages, in accordance with one embodiment of the present invention.

FIG. 7 illustrates in more detail a model delay block 237 which is designed to model the delay for a priority resolver 102 having two stages. If the priority resolver 102 were to include three stages as is illustrated in FIG. 5, the model delay block 237 would include three models of the priority resolver sub-unit 102a. As shown in FIG. 7, a model of the priority resolver sub-unit 102a is shown as 102a'. When the priority resolver sub-unit 102a' is implemented, the match line inputs are arranged as shown.

That is, the inputs of the first model of the priority resolver sub-unit 102a' are respectively wired such that the first match line input is tied HIGH and the next 15 match line inputs 122 are tied LOW. In alternate embodiments, the first match line does not necessarily have to be the one tied HIGH, the one tied HIGH depends upon the slowest path through the priority resolver sub-unit 102a. The output (pehit) 114 is then fed into the first match line input of the next model priority resolver sub-unit 102a'. The rest of the match line inputs are also tied LOW as was the case for the first model priority resolver sub-unit 102a'. The output 110 of the last priority resolver sub-unit 102a' is then fed back as a signal 236' to the enable of the priority resolver sub-unit 102a' in the first stage. The model delay path 112 is thus generated and output to the priority encoder control block 108 as described with reference to FIG. 2. It should be understood that the model delay path 112 signal is one of the resolved match line data 110 signals corresponding to the 122 signal whose input is tied HIGH. It should be understood that the model delay block 237 is scalable to meet the demands of any size priority resolver 102. That is, if the priority resolver 102 were to have three or more stages, the model delay block 237 will also have a number of priority resolver sub-units 102a' to match the delay associated with each stage.

Although pointed out above, it is important to understand that the priority resolver 102 is a device having low power consumption characteristics, and avoids extraneous transitions at the outputs. To recap, if a priority resolver has two stages as is the case in FIG. 4, only one priority resolver sub-unit 102a in the first stage will be turned ON and the second stage priority resolver will be turned ON since it is the last stage in a two-stage device. This provides substantial power savings since all 16 priority resolver sub-units 102a of stage 1 are not turned ON, and only the single priority resolver sub-unit 102a that needs to be turned ON in stage 1 will turn ON.

The power savings are even significantly increased in a three-stage device such as that shown in FIG. 5. In FIG. 5, there are 256 priority resolver sub-blocks 102a. The second stage includes 16 priority resolver sub-blocks 102a. In this case, only one priority resolver sub-unit 102a in the first stage will turn ON, and one in the second stage will turn ON, and the third stage which only includes a single priority resolver unit will turn ON. As such, only the priority resolver sub-units 102a that are required to be turned ON will turn ON during a particular search, thus eliminating the need to turn ON all priority resolver sub-units 102a. In this 3-stage example, three priority resolver sub-units 102a will turn ON out of the 273 priority resolver sub-units 102a present in the priority resolver tri-stage unit 102c.

Alternative embodiments of the present invention, may have all encoder sub-units (102a) enabled in a particular stage in order to enhance speed at all the expense of power. For example, instead of waiting for the results of a subsequent stage, intermediate stages may be enabled ahead of time to resolve their own respective match line inputs. In this embodiment, a model delay block (237) is configured to enable intermediate stages, while another model delay block (237) is configured to enable the final stage. In the configuration where intermediate stages are enabled, much of the power used to pre-compute intermediate results is wasted because only the resolved outputs (110) from one priority encoder sub-unit (102a) in each stage is used for computing final result. One skilled in the art, should note that for efficiency, it is more favorable to enable stages that are close to the final stage where there are fewer number of priority encoder sub-units (102a).

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, N.Y. may be used to design an appropriate silicon-level layout. Although any suitable design tool may be used, another layout tool may include a hardware description language "Verilog®" tool available from Cadence Design Systems, Inc. of Santa Clara, Calif.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Additionally, the various block diagrams may be embodied in any form which may include, for example, any suitable computer layout, semiconductor substrate, semiconductor chip or chips, printed circuit boards, packaged integrated circuits, or software implementations (and combinations thereof). Accordingly, those skilled in the art will recognize that the present embodiments are to be considered as illustrative and not restrictive, and the invention is not to be limited to the details given herein, but may be modified within the scope and equivalents of the appended claims.

What is claimed is:

1. A priority resolver for use in a CAM circuit priority encoder, comprising:
   a priority resolver sub-unit including,
      local hit generation circuitry, the local hit generation circuitry being configured to generate pehit data;
      a resolve processing circuit being coupled to the local hit generation circuitry, the resolve processing circuit further being configured to receive the pehit data and an enable signal; and
      an output differentiator and gating circuit being configured to receive an output of the resolve processing circuit;
   whereby the priority resolver sub-unit is implemented in one or more stages of the priority resolver.

2. A priority resolver for use in a CAM circuit priority encoder as recited in claim 1, wherein each stage being configured to include one or more priority resolver sub-units.

3. A priority resolver for use in a CAM circuit priority encoder as recited in claim 2, wherein one or more of the priority resolver sub-units in each stage is configured to be activated by the enable signal.

4. A priority resolver for use in a CAM circuit priority encoder as recited in claim 2, wherein only one of the priority resolver sub-units in each stage is configured to be activated by the enable signal.

5. A priority resolver for use in a CAM circuit priority encoder as recited in claim 1, wherein the local hit generation circuitry and the output differentiator and gating circuit is configured to maintain the resolve processing circuit in an inactive state until selectively activated by the enable signal.

6. A priority resolver for use in a CAM circuit priority encoder as recited in claim 1, wherein the priority resolver is configured to have one or more (N) stages, and each stage has M match line inputs, the priority resolver being configured to receive $M^N$ match line inputs, whereby M and N are integers greater than 1.

7. A priority resolver for use in a CAM circuit priority encoder as recited in claim 6, wherein the priority resolver that is configured to receive 16 match line inputs includes a single (N) stage priority resolver sub-unit having 16 match line inputs.

8. A priority resolver for use in a CAM circuit priority encoder as recited in claim 6, wherein the priority resolver that is configured to receive 256 match line inputs includes two stages, and a first (N) stage of the two stages includes 16 priority resolver sub-units having 16 match line inputs and a (N) second stage of the two stages includes 1 of the priority resolver sub-unit having 16 match line inputs.

9. A priority resolver for use in a CAM circuit priority encoder as recited in claim 1, wherein the local hit generation circuitry includes a dynamic NOR logic pulldowns circuit, a dynamic NOR logic pull-up circuit and a buffer and feedback unit circuit, the dynamic NOR logic pulldowns circuit being configured to output the pehit data, the pehit data being routed to a next stage as an input to an local hit generation circuitry of the next stage, and the pehit data further being communicated to an enable AND logic of the resolve processing circuit.

10. A priority resolver for use in a CAM circuit priority encoder as recited in claim 9, wherein the enable AND logic is configured to receive the pehit data and the enable signal, and if the enable signal is active, the resolve processing circuit is activated.

11. A priority resolver for use in a CAM circuit priority encoder as recited in claim 9, wherein when the priority resolver sub-unit is a last stage of the priority resolver, the priority resolver sub-unit receives the enable signal from a model delay block.

12. A priority resolver for use in a CAM circuit priority encoder as recited in claim 1, wherein the resolve processing circuit includes a dynamic NOR pull down array, and the dynamic NOR pull down array includes NOR circuitry of different sizes ranging from a smaller size at one end to a larger size at an opposite end.

13. A priority resolver for use in a CAM circuit priority encoder as recited in claim 12, wherein the dynamic NOR pull down array is configured to perform thermometer code generation.

14. A priority encoder, comprising:
   a priority resolver being configured to receive match line data and generate a plurality of resolved match lines, a model delay signal, and a global pehit signal;

a priority encoder control block being configured to receive the model delay signal from the priority resolver;

a multiple match block, the multiple match block being configured to receive the match line data, the plurality of resolved match lines from the priority resolver, and control from the priority encoder control block, the multiple match block being configured to generate a mult signal when multiple matches are detected; and an address encoder, the address encoder being configured to receive the plurality of resolved match lines and is configured to communicate with the priority encoder control block and generate an address.

15. A priority encoder as recited in claim 14, wherein the multiple match block includes a plurality of inverter and AND gate pairs, each inverter and AND gate pair being coupled to one of the plurality of resolved match lines, match line data, and a clock signal.

16. A priority encoder as recited in claim 15, wherein the one of the plurality of resolved match lines is connected to one inverter of the plurality of inverters, an output of the one inverter of the plurality of inverters is connected to one AND gate, a signal of the match line data is connected to the one AND gate, and the clock is further connected to the one AND gate.

17. A priority encoder as recited in claim 16, wherein an output of the one AND gate is connected to a pull down transistor, the pull down transistor being active when the one AND gate generates a HIGH.

18. A priority encoder as recited in claim 14, wherein the priority resolver includes one or more priority resolver sub-units.

19. A priority encoder as recited in claim 18, wherein each of the priority resolver sub-units comprises:

local hit generation circuitry, the local hit generation circuitry being configured to generate pehit data;

a resolve processing circuit being coupled to the local hit generation circuitry, the resolve processing circuit further being configured to receive the pehit data and an enable signal;

an output differentiator and gating circuit being configured to receive an output of the resolve processing circuit;

whereby the priority resolver sub-unit is implemented in one or more stages of the priority resolver, each stage being configured to include one or more priority resolver sub-units, and only one priority resolver sub-unit in each stage is configured to be activated by the enable signal.

20. A priority encoder as recited in claim 19, wherein the local hit generation circuitry and the output differentiator and gating circuit is configured to maintain the resolve processing circuit in an OFF state until selectively activated by the enable signal.

21. A priority resolver circuit, comprising:

a first stage, the first stage including a first plurality of priority resolver sub-units, each priority resolver sub-unit including local hit generation circuitry, resolve processing circuitry, and output differentiator and gating circuitry;

a second stage, the second stage including a second plurality of priority resolver sub-units; and a third stage, the third stage including a single priority resolver sub-unit;

whereby only one priority resolver sub-unit is configured to be active at one processing time in each of the first, second and third stages of the priority resolver circuit.

22. A priority encoder circuit, comprising:

a plurality of priority resolver stages, each stage configured to include one or more priority resolver sub-units, each priority resolver sub-unit including local hit generation circuitry, resolve processing circuitry, and output differentiator and gating circuitry; and one or more model delay blocks, each of said model delay blocks being configured to enable any one of the priority resolver sub-units in each of the plurality of priority resolver stages.

23. A priority resolver for use in a CAM circuit priority encoder, comprising:

a priority resolver sub-unit including,
local hit generation circuitry, the local hit generation circuitry being configured to generate hit data;
a resolve processing circuit including input gating circuitry is coupled to the local hit generation circuitry, the resolve processing circuit is configured to receive the hit data and an enable signal; and
an output differentiator and gating circuit being configured to receive an output of the resolve processing circuit;
whereby the priority resolver sub-unit is implemented in one or more stages of the priority resolver.

24. A priority resolver for use in a CAM circuit priority encoder as recited in claim 23, wherein the resolve processing circuit further includes, a buffer delay match unit;

a local model delay pull up unit;

a local resolve model delay unit;

a match delay unit; and a dynamic NOR pull down array.

* * * * *